United States Patent [19]

Groves et al.

[11] Patent Number: 5,034,621
[45] Date of Patent: Jul. 23, 1991

[54] INDUCTIVE PROXIMITY SWITCH EXHIBITING MAGNETIC FIELD IMMUNITY

[75] Inventors: John P. Groves; Joseph Lazzaro, both of Milwaukee; Gregory L. Nadolski, Brookfield; Donald L. Van Zeeland, Franklin, all of Wis.

[73] Assignee: Eaton Corporation, Cleveland, Ohio

[21] Appl. No.: 133,755

[22] Filed: Dec. 16, 1987

[51] Int. Cl.[5] .................... H02H 3/08; H01H 35/00
[52] U.S. Cl. .................................. 307/117; 361/93; 307/308; 269/32; 269/233; 269/329
[58] Field of Search ............... 3.7/116, 308; 200/82 E, 200/47; 361/87, 93; 269/32, 93, 233

[56] References Cited

U.S. PATENT DOCUMENTS

| | | | |
|---|---|---|---|
| 4,162,387 | 7/1969 | De Candia | 219/79 |
| 4,230,023 | 10/1980 | Ward | 92/5 L |
| 4,316,145 | 2/1982 | Tann | 324/208 |
| 4,396,183 | 8/1983 | Lymburner | 269/32 |
| 4,553,040 | 11/1985 | Trüper et al. | 307/116 |
| 4,583,006 | 4/1986 | Okada et al. | 307/116 |
| 4,672,500 | 6/1987 | Roger et al. | 361/93 |

FOREIGN PATENT DOCUMENTS

| | | |
|---|---|---|
| 3318434 | 11/1984 | Fed. Rep. of Germany . |
| 3403961 | 8/1985 | Fed. Rep. of Germany . |
| 2339766 | 2/1976 | France . |
| 2550115 | 2/1985 | France . |

Primary Examiner—Derek S. Jennings
Attorney, Agent, or Firm—J. G. Lewis

[57] ABSTRACT

A proximity switch assembly (10) for signaling the location of a movable member (36) at either of opposite end limits of movement relative to a stationary frame (44, 46) includes a compact elongate housing (58) adapted to be mounted on the frame to extend along the path of movement of a power driven member (32), such as the piston rod of a hydraulic cylinder, which shifts the movable member between its end limits. The proximity switch is fixedly mounted in the housing and carries a switch actuating member (68) mounted for sliding movement over a relatively short distance sufficient to move an actuating target (74) into and out of actuating proximity of an air core proximity sensing coil (120) within the housing. Lost motion abutment shoulders (70, 72) on the switch actuation member and power driven member (54) move into engagement with each other as a power driven member approaches each end of its stroke.

18 Claims, 6 Drawing Sheets

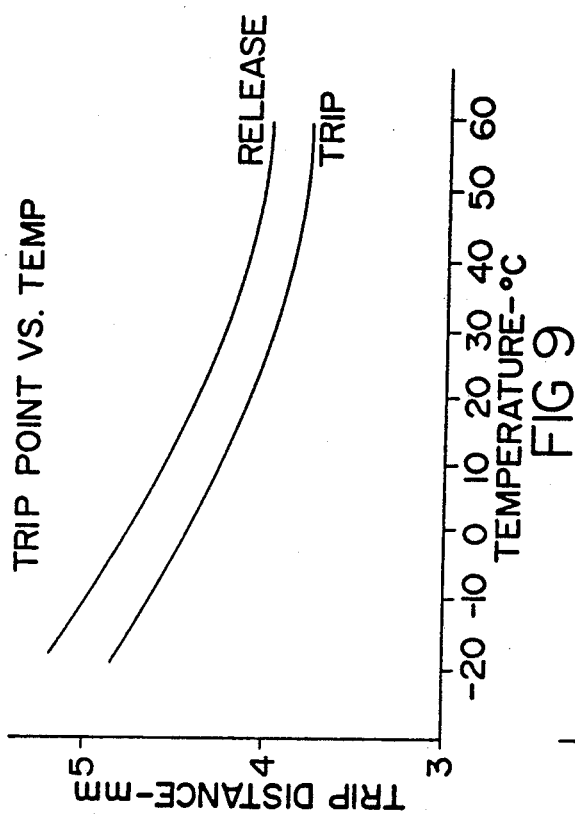
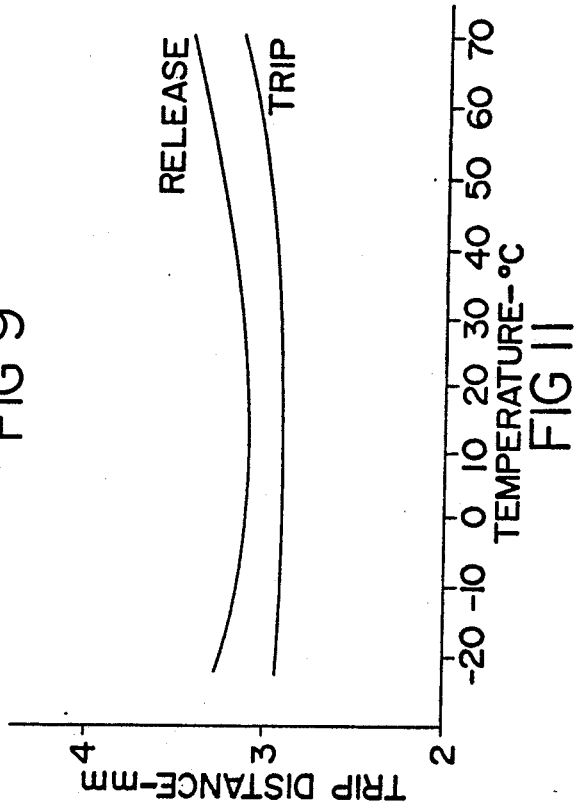
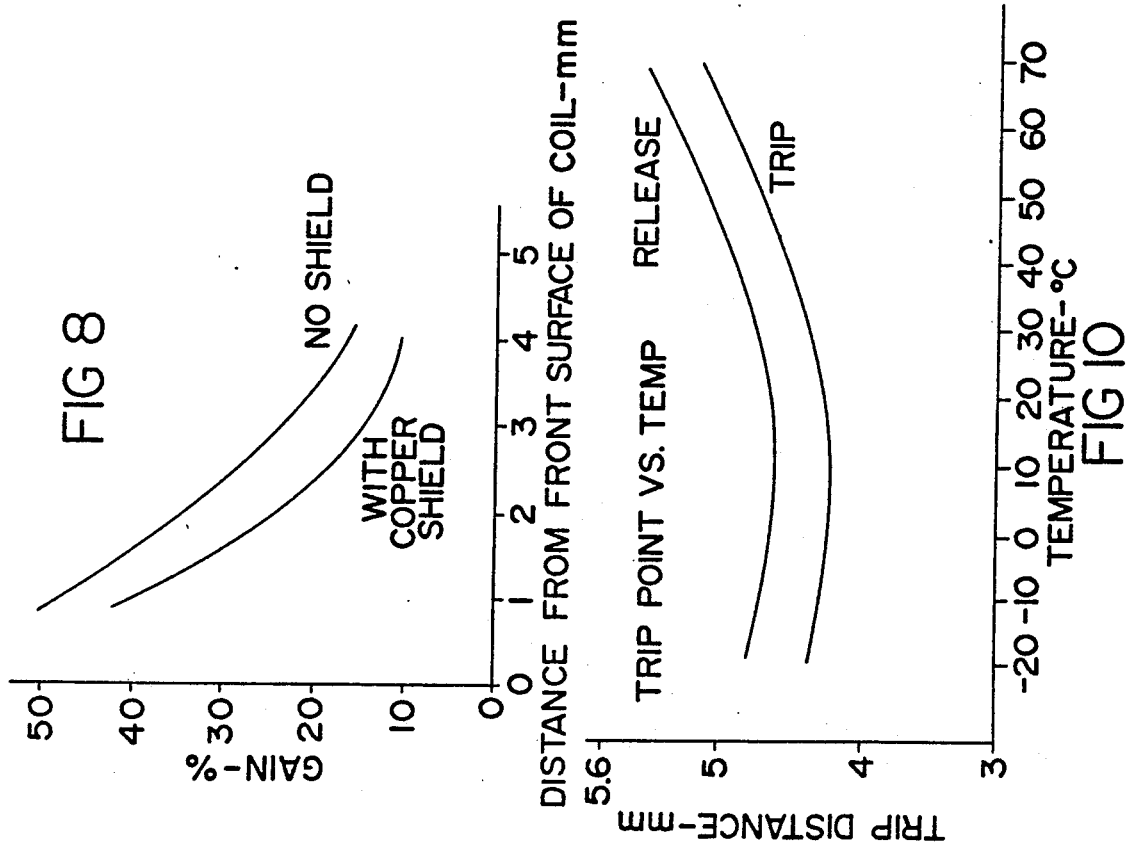
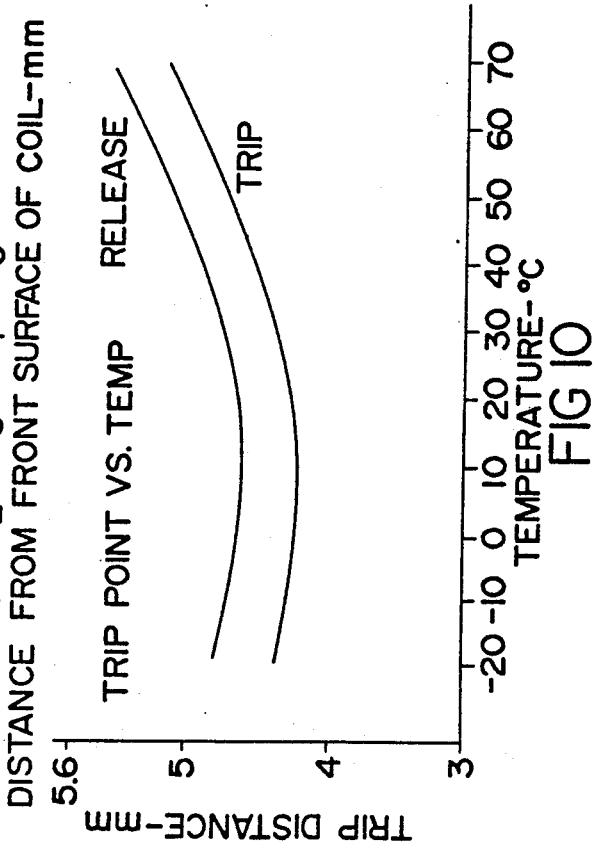

INDUCTIVE PROXIMITY SWITCH EXHIBITING MAGNETIC FIELD IMMUNITY

TECHNICAL FIELD

The present invention relates to an apparatus for detecting the location of a movable member at either of two end limits of movement and is particularly directed to an inductive proximity switch of the type that utilizes an oscillator drive circuit in combination with an induction tank circuit to generate a target sensing field.

CROSS-REFERENCE TO RELATED APPLICATIONS

The present invention is related to that disclosed and claimed in U.S. Pat. No. 4,664,364 to Lymburner, entitled Proximity Switch Assembly and U.S. Pat. No. 4,543,527 to Schuchmann et al, entitled Proximity Switch Exhibiting Improved Start-Up Characteristics. This application is also related to a copending application entitled Circuit Board Holder for Proximity Sensor, U.S. Ser. No. 133,819, filed Dec. 16, 1987, now U.S. Pat. No. 4,875,009 in the name of Dennis Leveque and assigned to the assignee of this application.

BACKGROUND OF THE INVENTION

Proximity switches are generally known in the art and have been widely applied to sense the position of a moving object in manufacturing processes. Such known proximity switches utilize an oscillator drive circuit in combination with an induction tank circuit. The tank circuit includes an induction coil as a means for sensing the presence of an object such as metal. The induction coil is constructed such that it generates a magnetic field in an area surrounding the coil. The magnetic field induces eddy currents in a conductive object which comes within the generated magnetic field. Such objects are known in the art as targets. Once a target comes within the magnetic field of the coil, energy is drawn from the induction coil. A typical induction proximity switch selects components of the oscillator and tank circuit to insure that oscillations occur when a target is absent from the magnetic field of the induction coil. When a target comes within the magnetic field of the induction coil, the oscillation amplitude is attenuated due to the loss of energy caused by eddy currents induced in the target. The amount of the oscillation attenuation is directly related to the distance between the target and the induction coil.

A predetermined distance between the induction coil and the target is selected as the point where the output of the proximity switch changes an electrical state to indicate the presence of a target. This distance is known as the switch trip point. A circuit within the proximity switch monitors the oscillation amplitude and generates a signal at the output of the proximity switch indicative of the fact that the target has come within the trip point distance.

Most inductive proximity switches employ a ferrite cup core and coil assembly as the transducer or sensing element. This is connected to an oscillator, usually operating between 100 and 600 KHz. The frequency is determined by the resonant frequency of the coil and a high quality tuning capacitor. A cup core is preferred because it allows for the flux field to be focused in front of the cup core, allowing a further sensing distance. The cup core, however, is a liability when used in high magnetic field environments, such as in or near the throat of a welder. The ferrite material saturates in these fields, causing the oscillator to damp because of the resulting tank Q degradation. This action makes the oscillator act as though a target is present. Prior art attempts to overcome this problem have employed innovative oscillator designs and oscillator detector and hold circuitry. This approach has been partially successfully for the reason that the welding field is sinusoidal in nature and there is a time in ever half cycle when the field is passing through zero. During this period, the oscillator is designed to rapidly build up and the detector responds rapidly, holding the detected voltage during the time the magnetic field builds up and damps the oscillator. While this can be accomplished satisfactorily, this type of oscillator is inherently more complicated and costly. In addition, there is still an upper limit as to the strength of magnetic field to which the current can be made immune.

There is presently an acute need for proximity switches which can be used in conjunction with pneumatic or hydraulic cylinders in automated manufacturing to detect when a host cylinder has reached either limit of travel. In automated manufacturing applications, particularly ganged welding of work pieces, numerous power actuated devices are employed, the actuation of which must be carefully choreographed for efficient work piece flow. Typically, separate proximity switches have been used for each actuator to separately detect each limit of travel. Because of the large number of proximity switches required, low cost and simplicity of design are paramount.

Another problem with prior art proximity switches lies in the fact that in adapting them for use with high pressure hydraulic cylinders, expensive and time-consuming modification to the cylinders themselves must be made.

Still another problem of prior art proximity switches lies in the fact that the commercially available switch designs will not function properly when in close proximity to the extremely high electromagnetic fields generated by industrial welding operations. Shielding such proximity switches from external sources of electromagnetic energy has proven to be only partially effective and expensive.

A final problem with prior art proximity switches lies in their typical lack of overload detection and short circuit protection. When such features are available, they can be costly, complex and unreliable.

BRIEF DESCRIPTION OF THE INVENTION

The present invention provides a new and improved proximity switch of the type that utilizes a tank circuit energized by an oscillator drive circuit. The new apparatus in accordance with the present invention is designed to eliminate the need for two switches located at each end of a host power actuated device such as a hydraulic cylinder. The new apparatus is also designed to operate in close proximity to welding equipment and other sources of intense electromagnetic radiation and is effectively immune from the effects thereof.

The proximity detection switch of the present invention comprises means operative to change its conductive state in response to receipt of a control signal, an inductive circuit element, means to electrically energize the inductive element and thereby establish a flux field of a given amplitude thereabout, the flux field being contained substantially within the atmosphere surrounding the inductive element. The proximity switch also includes target means which is displaceable between a position the inductive element and a sensed position with the flux field adjacent or near the inductive element so as to effect a change in the field's amplitude, circuit means generating the control signal as a function of detected changes in the flux field amplitude and, finally, a lost motion mechanism interconnecting the moving member of the power actuated device and the target means such that the target means will selectively move between its remote and sensed positions only as the power actuated device member approaches one or the other of its predetermined limits of travel. This arrangement provides a switch in which target position can be accurately controlled and, thus, the sensing distance minimized. Furthermore, use of an air coil provides almost unlimited magnetic field immunity because there is no ferrite core to saturate.

In the preferred embodiment, the search coil is entirely closed in a metallic housing. Thus, the coil is protected from external side targets. An alternative construction is envisioned however, employing a nonmetallic housing in which the coil is protected from the side targets by placing the coil in a copper shield which acts as a remote shorted turn. This arrangement allows an apparatus which can be located extremely close to sources of intense electromagnetic energy.

According to another aspect of the invention, the proximity switch further includes means for selectively varying the characteristic field amplitude in a manner independent of the position of the target means. This arrangement has the advantage of permitting calibration and adjustment of the desired trip distance.

According to still another aspect of the present invention, means are provided to sense current flowing through the switch and operative to change its state from conductive to open an overload current condition occurs. This deenergization of the output stage is regenerative, i.e., will continue as long as the sensed current exceeds a predetermined level. When the overload is removed, the output stage will again operate normally.

These and other features and advantages of the present invention will become apparent upon reading the following specification, which, along with the patent drawings, describes and discloses a preferred embodiment of the invention in detail.

A detailed description of the embodiment of the invention makes reference to the accompanying drawings.

BRIEF DESCRIPTION OF THE DRAWINGS

FIG. 8 is a graphical illustration of the equivalent tank impedance at resonance as the steel target approaches the front surface of the coil;

FIG. 9 is a graphical illustration of the variation of trip distance versus temperature for a given coil;

FIG. 10 is a graphical illustration of the variation of trip distance versus temperature for an alternative coil for a far set distance; and FIG. 11 is a graphical illustration of the variation of trip distance versus temperature for the alternative coil of FIG. 10 for a moderate set distance.

DETAILED DESCRIPTION OF THE PREFERRED EMBODIMENT OF THE INVENTION

Figure 1:
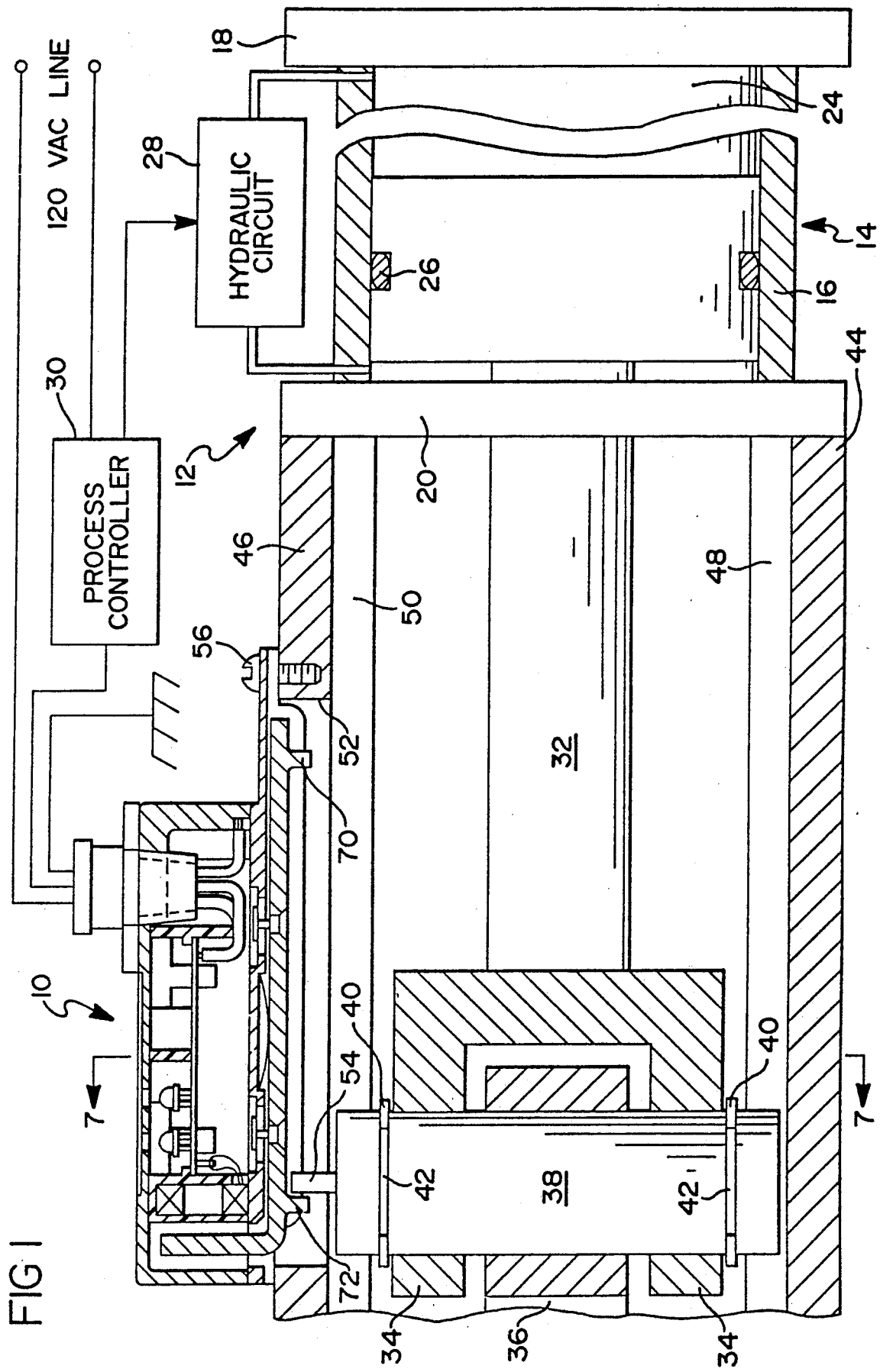
FIG. 1 is an assembly in cross section of a proximity switch made in accordance with the present invention in combination with a power actuated device.
Figure 2:
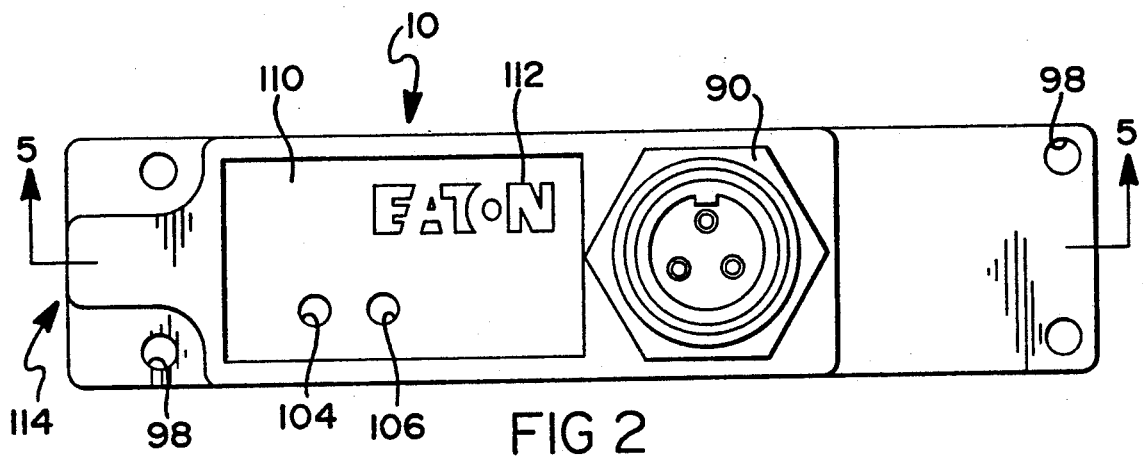
FIG. 2 is a top plan view of the proximity switch of FIG. 1 on an enlarged scale.
Figure 3:
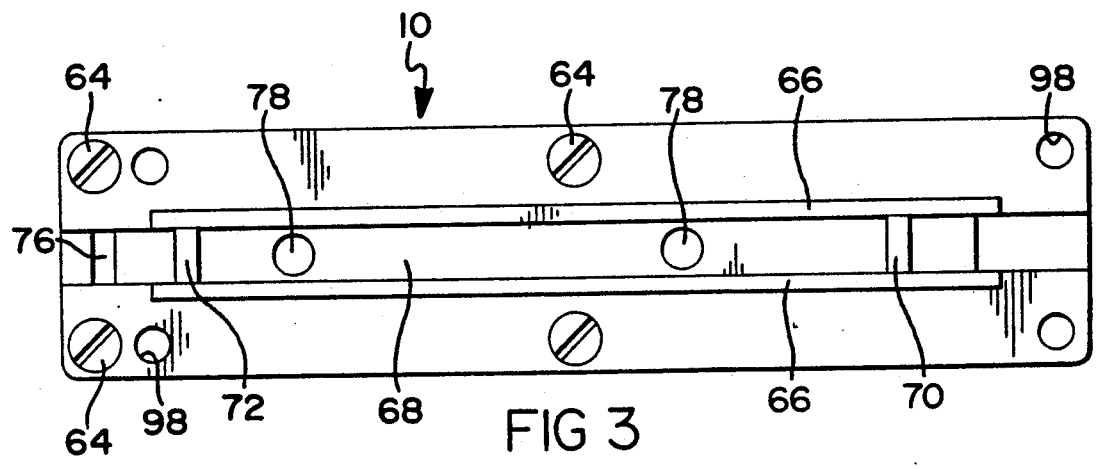
FIG. 3 is a bottom plan view of the proximity switch of FIG. 1 on the scale of FIG. 2.
Figure 4:
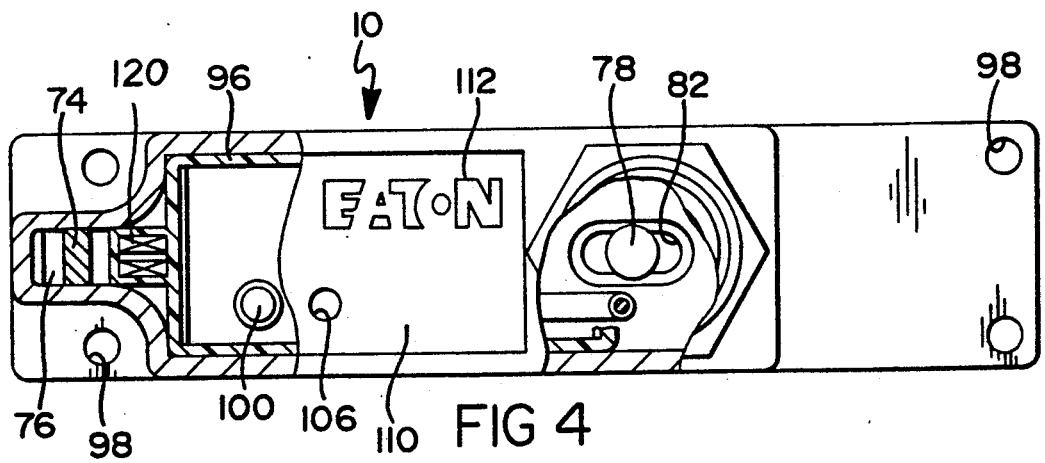
FIG. 4 is a top plan view of the proximity switch of FIG. 2 with portions thereof broken away to reveal internal details thereof.
Figure 5:
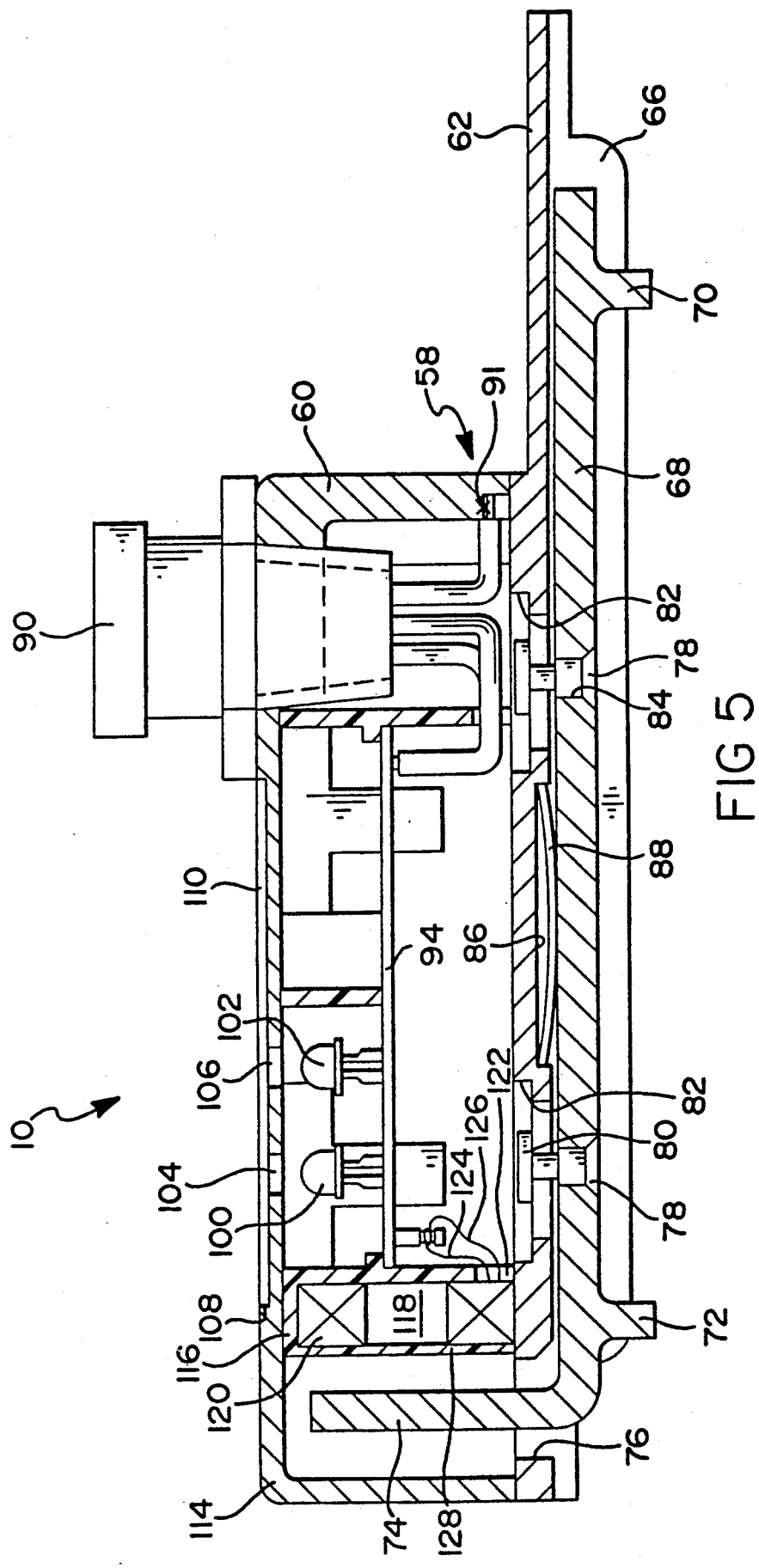
FIG. 5 is a cross sectional side view of the proximity switch taken on lines 5—5 of FIG. 2 on a further enlarged scale.

Referring to FIG. 1, a proximity switch 10 is shown in assembly with a power actuated device 12. In the preferred embodiment of the invention, device 12 comprises a hydraulic cylinder including a housing assembly 14 made up of a cylindrical wall member 16 closed at each end by cap 18 and 20. A piston 22 is slidably disposed within cavity 24 defined by wall member 16. Piston 22 carries an annular seal 26 at the interface of the circumference of piston 22 and the inner diameter surface of wall member 16.

Device 12 is controlled by a hydraulic circuit 28 which is in fluid communication with portions of cavity 24 on each side of piston 22 to effect controlled displacement of piston 22 between a first limit of travel (illustrated) wherein piston 22 is nearly contacting end cap 20 and a second limit of travel wherein piston 22 is displaced rightwardly from its illustrated position and is nearly contacting end cap 18. Hydraulic circuit 28 is controlled by a process controller 30 which receives device position feedback information from proximity switch 10. The specific design details of hydraulic circuit 28 and process controller 30 are not deemed germane to the present invention and are deleted here for the sake of brevity.

A piston rod 32 is carried by piston 22 and extends axially outwardly from housing assembly 14 through end cap 20, terminating in a bifurcated yoke 34 which is interconnected with a structural link member 36 through a pin 38. Pin 38 is held in its illustrated position with respect to yoke 34 by C-clips 40 disposed within outwardly opening circumferential slots 42 formed in pin 38.

Figure 7:
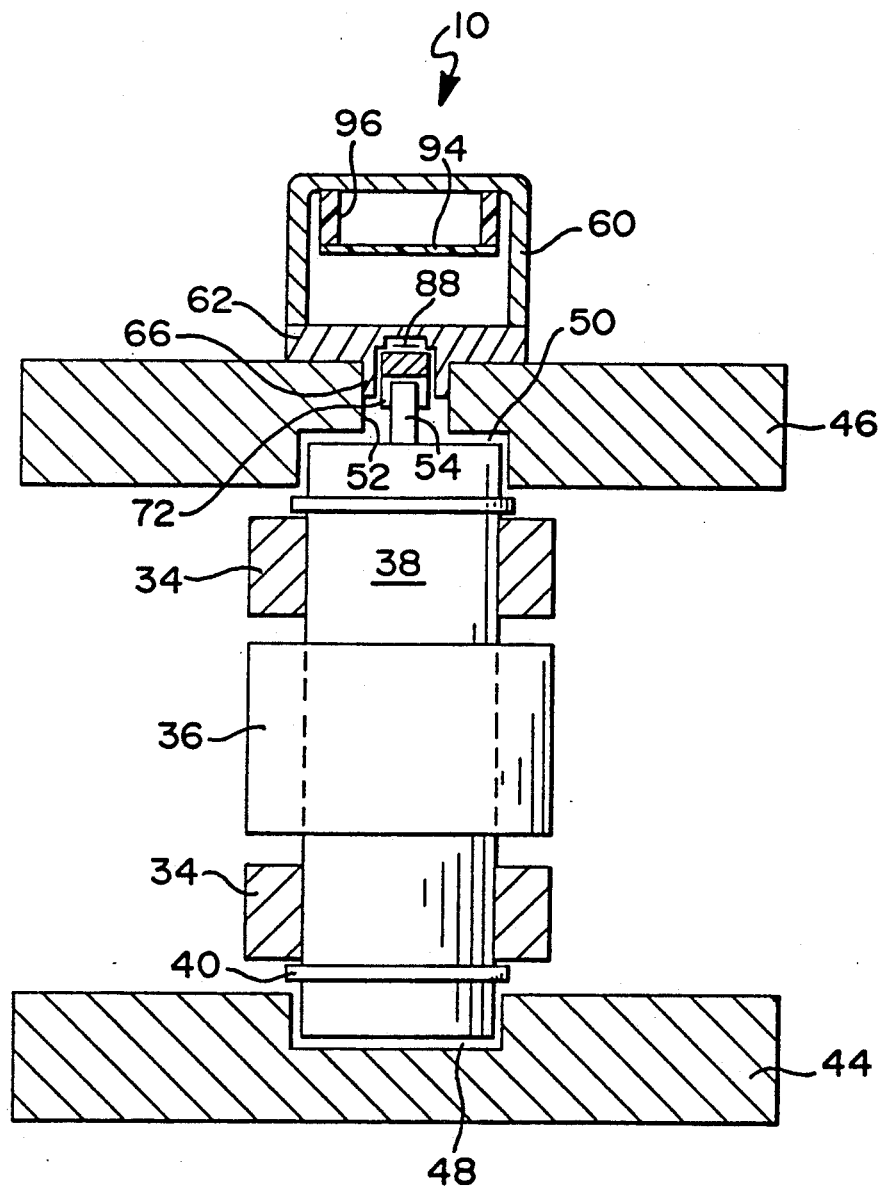
FIG. 7 is a cross sectional view of the proximity switch taken on lines 7—7 of FIG. 1.

Power actuated device 12 also includes parallel housing extensions or rails 44 and 46 extending from end cap 20 and straddling piston rod 32. Rails 44 and 46 have axially directed inwardly opening elongated slots 48 and 50, respectively for receiving the opposed outwardly projecting ends of pin 38. As can best be seen in FIG. 7, slots 48 and 50 allow piston 22, piston rod 32, yoke 34, link member 36 and pin 38 to move axially between the first and second limits of travel but prevent rotation thereof. This arrangement guides and supports the distal end of piston rod 32 in straight line movement throughout its entire stroke.

It is contemplated that link member 36 will engage an apparatus employed in a manufacturing process such as a power actuated clamp described in U.S. Pat. No. 4,664,364 the specification of which is incorporated herein by reference.

Proximity switch 10 nests within an elongated slot 52 within rail 46. Slots 50 and 52 are in register, receiving a pin 54 extending axially upwardly from pin 38 within slot 52. Proximity switch 10 is affixed to rail 46 by screws 56 or other suitable fastening means.

Referring to FIGS. 2 through 5, the structural details of proximity switch 10 are illustrated. Proximity switch 10 includes a generally rectangular elongate housing assembly 58 including a cover member 60 and a base member 62 held in assembly by suitable fastening means such as screws 64. Members 60 and 62 are preferably formed of metal to shield internal components from external electromagnetic fields typically present in many manufacturing processes. However, it is contemplated that members 60 and 62 could be formed from plastic or other suitable nonmetallic material if alternative shielding is provided such as by metal foil cladding. Base member 62 has two downwardly extending guide members 66 integrally formed therewith which, in assembly, extend within slot 52 for positioning of housing assembly 58 with respect to rail 46. Guide members 66 are laterally spaced and receive an elongated carrier member 68 therebetween. Carrier member 68 has two abutment shoulders 70 and 72 integrally formed therein extending downwardly into slot 52 of rail 46. As will be described in detail hereinbelow, abutment shoulders 70 and 72 are integrally formed within carrier member 68 proximate the ends thereof and extend far enough into slot 52 to entrap the upwardmost end of pin 54. A target member 74 is integrally formed from the end of carrier member 68 associated with abutment shoulder 72 extending upwardly within housing assembly 58 through a slot 76. Slot 76 is axially extended to permit limited axial displacement of target 74 within housing 58. Carrier 68, including abutment shoulders 70 and 72 and target 74 are formed from metal.

Carrier 68 is retained in assembly with base member 62 by rivets 78. Rivets 78 include a pan head portion 80 slidably received within an elongated stepped bore 82 formed in base member 62. The portion of rivets 78 distal from head 80 are received within registering bores 84 in carrier 68 and held in place by welding, swaging or other suitable techniques. Base member 62 has an axially elongated downwardly opening pocket 86 formed therein overlying the upper surface of carrier 68. A bow spring 88 is disposed within pocket 86, having ends bearing against the axial ends thereof and bending downwardly in the central portion thereof to bear against the uppermost surface of carrier 68. Thus, carrier 68 is held in assembly by rivet 80 and is permitted limited axial freedom of movement determined by the axial extent of slots 82. Spring 88 biases carrier 68 downwardly to prevent rattling and to enhance smooth predictable displacement of carrier 68 with respect to housing 58.

Cover member 60 has an industrial quality three pin connector 90 mounted thereon for interfacing proximity switch 10 with process controller 30 and a source of line voltage. Within proximity switch 10, one of the lines from connector 90 is grounded at 91 to cover member 60 by welding, soldering or other suitable means. The remaining two lines are routed to and electrically interconnected with an electronic circuit 92, shown schematically in FIG. 6, the components of which are carried by a circuit board 94. Circuit board 94 is insulatively held in its illustrated position by a holder 96 nested within cover member 60. Circuit board holder 96 performs a number of discrete functions and is the subject of U.S. Pat. No. 4,875,009, the specification of which is incorporated herein by reference.

Through bores 98 are provided in each corner of base member 62 for receiving screws 56.

Circuit board holder 96 is formed of electrically insulating plastic or other suitable material and is generally rectangular in shape having its upper and lower ends substantially open. Through a series of tabs, abutments surfaces and snap fittings, holder 96 operates to retain circuit board 94 in its illustrated position and spaced from housing 58. Essentially all of the discrete components of circuit 92 are carried by circuit board 94 including two light emitting diodes 100 and 102 which are positioned in register with optically clear windows 104 and 106 formed in cover member 60 to permit an operator to observe certain operating conditions of proximity switch 10, as will be described in detail hereinbelow. Windows 104 and 106 are through bores formed within cover member 60, opening within a pocket or recess 108 formed in the top surface of cover member 60. An optically transparent or translucent label 110 is adhesively retained within pocket 108. Label 110 serves to carry advertising or instructional indicia thereon while serving as a protective lens covering windows 104 and 106.

Cover member 60 has an area of reduced lateral dimension shown generally at 114 at the end thereof nearest target 74. Circuit board holder 96 has a narrowed portion 116 integrally formed therewith extending leftwardly as viewed in FIG. 5 within area 114. Portion 116 defines a cavity 118 nestingly receiving an induction coil 120 therein. A localized slot 122 is provided in circuit board holder 96 for routing of leads 124 and 126 from coil 120 to circuit board 94. The left-handmost surface of portion 116 provides a protective barrier 128 of known thickness (1 mm) between coil 120 and target 74.

Referring to FIG. 1, piston rod 32 is shown in its fully extended end limit of movement wherein pin 54 is engaged with abutment shoulder 72 and has positioned carrier 68 in its left-handmost limit of travel. With carrier 68 in the position shown in FIG. 1, its target 74 is beyond the actuating proximity of coil 120 of the proximity switch and the switch is in its unactuated or switch off position. When piston rod 32 is driven from the FIG. 1 position to the right as viewed in FIG. 1, pin 54 will be disengaged from abutment shoulder 72 as soon as this movement starts. However, carrier 68 will remain in the FIG. 1 position and proximity switch 10 will remain in the switch off condition. As piston rod 32 approaches its fully retracted position, pin 54 will move into engagement with abutment shoulder 70 of carrier 68 and shift the carrier to the right as viewed in FIG. 1 to move target 74 toward coil 120. The spacing between abutment shoulders 70 and 72 is selected such that pin 54 will not engage shoulder 70 until piston rod 32 is within a relatively short distance of its fully retracted position. During this final stage of movement to fully retracted end limit, pin 54 will engage abutment shoulder 70 and drive carrier 68 to the right a sufficient distance to move target 74 into actuating range of coil 120. As soon as target 74 moves into range of coil 120, the proximity switch 10 shifts to its switch on position. Upon subsequent return of piston rod 32 to its fully extended end limit of movement, a similar action occurs, that is, switch 10 remains in its on position until, near the end of its stroke, pin 54 engages abutment shoulder 72 and returns carrier 68 to its switch off position as piston rod 32 arrives at its fully extended position.

Figure 6:
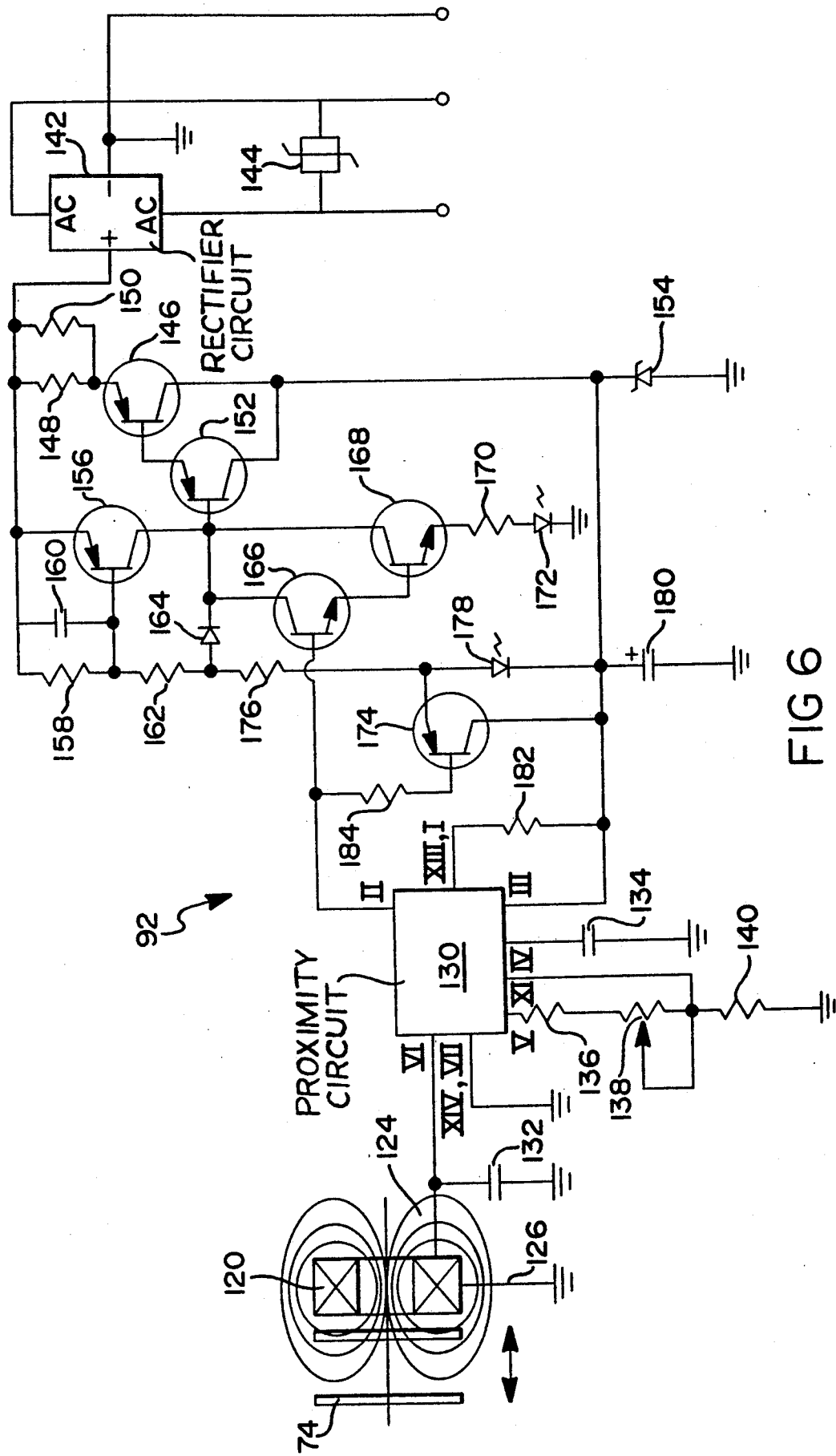
FIG. 6 is a schematic representation of the circuit of the proximity switch of FIG. 1.

Referring to FIG. 6, circuit diagram 92 of proximity switch 10 is illustrated. The applicants have found that the apparatus described hereinabove permits extremely accurate positioning of target 74 with respect to coil 120, permitting a minimum sensing distance. The use of an air coil 120, lacking a ferrite core which can saturate, provides almost unlimited magnetic field immunity. Because coil 120 is substantially enclosed in metallic housing 58, it is protected from external side targets.

FIG. 8 shows the percent reduction of the equivalent tank impedance at resonance, (Rp) as the steel target 74 approaches the front surface of coil 120. This percent reduction is commonly called the transducer gain. In the application, target 74 moves from almost flush with the 1 mm barrier 128 protecting coil 120 to 2.5 mm from the barrier. This translates to a movement of 1 mm to 3.5 mm from the front surface of the coil 120. Curves are plotted for both the shielded and unshielded versions. The presence of the copper shield degrades the gain somewhat but provides a great deal of immunity from side targets if nonmetallic housing 58 is used. FIG. 8 represents experimental data taken without a metallic housing with a 0.75×1×0.25 inch copper shield flush with the front surface of a 300 turn 34 gauge coil operating at 140 KHz.

Referring to FIG. 6, lead 124 of coil 120 is connected to input terminal VI of a proximity switch integrated circuit 130. Lead 126 of coil 120 is connected to ground. The operation of circuit 130 is described in U.S. Pat. No. 4,543,527, the specification of which is incorporated herein by reference. Input terminal VI of IC 130 is interconnected to ground through a 2.2 nanofarad capacitor 132. Terminals XIV and VII of IC 130 are connected directly to ground and terminal IV is interconnected to ground through a 0.01 microfarad detector capacitor 134 which maintains tank oscillation amplitude. Terminal V of IC 130 is interconnected to ground through a series combination of a 8.2 k resistor 136, the fixed resistance portion of a 2 k potentiometer 138 and a 330 ohm resistor 140. Terminal XI of IC 130 is interconnected to the point of common connection of potentiometer 138 and resistor 140 as well as the wiper of potentiometer 138. The inputs from connector 90 are electrically connected to the AC input terminal of a 400 volt type VM48 rectifier manufactured by Varo 142. The AC terminals of rectifier 142 are bridged by a 220 volt varistor 144 for transient protection. The negative output terminal of rectifier 142 is connected to ground and to the remaining terminal of connector 90. The positive output terminal of rectifier 142 is interconnected to the emitter of an MPSA92 transistor 146 through a parallel combination of a 5.1 ohm resistor 148 and a 10 ohm resistor 150. Transistor 146 is connected as part of a Darlington pair with a second transistor 152 with the common collectors thereof connected to ground through a reverse biased 7.5 volt 1 watt zener diode 154. The positive output terminal of rectifier 142 is also directly connected to the emitter junction of a type MPSA63 transistor 156 and to the base of transistor 156 through a parallel combination of an 18 k ohm resistor 158 and a 0.001 microfarad capacitor 160. The base of transistor 156 is interconnected with the base of transistor 152 and the collector of transistor 156 through a series combination of a 10 k ohm resistor 162 and a forward biased diode 164. The base of transistors 156 and 152 are commonly connected to the collectors of the Darlington type MPSA42 transistor pair 166 and 168. The emitter junction of transistor 168 is interconnected to ground through a series combination of a 1.5 k ohm resistor 170 and a green type HLMP1790 LED 172.

The point of common connection between resistor 162 and the anode of diode 164 is interconnected to the emitter junction of a type 2N3906 transistor 174 through a 56 k ohm resistor 176. The emitter of transistor 174 is interconnected to ground through a series connected type HLMP1700 red LED 178 and a 2.2 microfarad electrolytic capacitor 180. Note that LEDs 100 and 102 of FIG. 5 correspond with LEDs 172 and 178 of FIG. 6, respectively. The cathode of LED 178 is connected to the cathode of zener diode 154, to the collector of transistor 174, to terminal III of IC 130 and interconnected to terminals I and XIII of IC 130 through a 330 k ohm resistor 182. The base of transistor 166 is electrically connected to output terminal II of IC 130 and interconnected to the base of transistor 174 through a 100 k ohm resistor 184.

Potentiometer 138 is employed to set nominal trip distance at 2.2 mm. The output of IC 130 pin II is held low when the oscillator is active i.e. target 74 remote from coil 120. As target 74 is moved towards coil 120, the oscillator is damped and the output at pin II is released and allowed to go high. When this happens, Darlington transistors 166 and 168 switch on green LED 172, pulling base current through the Darlington 146, 152 output stage, thus causing load current to flow through bridge 142 the output stage and zener 154. Transistor 156 is employed to monitor the voltage drop across the 3.3 ohm sampling resistor (148 and 150) and the two output stage $V_{be}$ drops. If the load current becomes excessive the cathode of diode 164 drops sufficiently to conduct and thus de-energize the output stage regeneratively. Current flows through the overload LED 178 since the LED bypass transistor 174 is de-energized because pin II is still high. When the overload is removed, the output stage will again operate normally. With the value shown, the output is rated for 100 ma before overload takes place.

Results of the variation of trip distance versus temperature are illustrated in FIG. 9. The trip distance was initially set at 4 mm (room temperature) which represents a transducer gain of 15%. The response of FIG. 9 is based upon a 300 turn coil of 34 gauge wire. Based upon the slope of the curve, a smaller wire size (35 gauge) will rotate the temperature response counter-clockwise as illustrated in FIG. 10. The temperature response for the coil of FIG. 10 is taken for a far sense distance and in FIG. 11 for a moderate sense distance. Low temperature operation has been improved using 35 gauge wire but high temperature performance has been degraded. Note that the curve of FIG. 11 flattens out as the unit is calibrated for closer trip distances. This is believed to be because of the higher gain of the sensed coil 120. At the anticipated trip distance of 2.2 mm in the actual application, the curve may be flatter yet.

In the cylinder application, higher temperature performance is probably preferred. In that case, 34 gauge wire would be a proper choice. If good performance is required over the entire temperature range, then 35 gauge wire would be chosen for its low temperature performance and a thermistor network would be added in series with the distance resistor, pin V of IC 130, to improve the high temperature performance.

It is to be understood that the invention has been described with reference to a specific embodiment to provide the features and advantages previously described and that such specific embodiments are susceptible of modification, such as will be apparent for those skilled in the art. Accordingly, the foregoing is not to be construed in a limiting sense.

We claim:

1. A proximity switch for use with a power actuated device including a member mounted for movement between predetermined limits of travel, said switch comprising:
   means operative to change conductive state in response to a control signal;
   an air coil;
   means operative to electrically energize said air coil to establish a flux field having a characteristic amplitude thereabout entirely within the atmosphere surrounding said air coil, said atmosphere comprising a substantially air filled void without ferrous material components;
   target means displaceable between a position remote from said air coil and a sensed position adjacent said air coil to effect a change in said characteristic amplitude;
   circuit means operative to generate said control signal as a function of said change in characteristic amplitude;
   means for interconnecting said member and target means to effect a lost motion therebetween whereby said target means transitions between said remove and sensed positions only as said member alternately approaches said predetermined limits of travel; and
   means operative to shield said field from external sources of electromagnetic energy.

2. The switch of claim 1, wherein said shield means comprises a metallic housing substantially enclosing said air coil.

3. The switch of claim 2, wherein said interconnecting means carries said target means substantially within said housing.

4. The switch of claim 1, wherein said shield means comprises a metallic liner disposed within a nonmetallic housing, said liner and target means coacting to substantially enclose said inductive element.

5. The switch of claim 1, wherein said target means is constructed of ferrous material.

6. The switch of claim 1, wherein the dimensional spacing of said member limits of travel substantially exceeds the dimensional spacing of said target means remote and sensed positions.

7. The switch of claim 1, further comprising means for selectively varying said characteristic amplitude independent of the position of said target means.

8. The switch of claim 2, wherein said air coil is generally disposed about a principle axis and said target means comprises a generally planar ferrous metal member displaceable along said axis.

9. The switch of claim 8, wherein said coil and target member are generally dimensionally coextensive on respective planes normal to said axis.

10. A proximity switch for use with a power actuated device including a member mounted for movement between predetermined limits of travel, said switch comprising:
    means operative to change conductive state in response to a control signal;
    an air coil;
    means operative to electrically energize said air coil to establish a flux field having a characteristic amplitude thereabout entirely within the atmosphere surrounding said air coil said atmosphere comprising a substantially air filled void without ferrous material components;
    target means displaceable between a position remote from said air coil and a sensed position adjacent said air coil to effect a change in said characteristic amplitude;
    circuit means operative to generate said control signal as a function of said change in characteristic amplitude;
    means for interconnecting said member and target means to effect a lost motion therebetween whereby said target means transitions between said remote and sensed positions only as said member alternately approaches said predetermined limits of travel; and
    means operative to sense current flowing through said means operative to change conductive state when in a closed state and to generate an overload current condition signal when said sensed current exceeds a predetermined level, said overload current condition signal being operative to change said conductive state changing means to an open state.

11. The switch of claim 10, further comprising means operative to generate a user sensible signal in response to said overload current condition signal.

12. The switch of claim 1, further comprising means operative to generate a user sensible signal as a function of the conductive state of said means operative to change conductive state.

13. In combination:
    a power actuated device including a rigid member mounted within a fixed frame for movement along a fixed path relative to said frame between a first end limit of travel and a second end limit of travel, power actuated means for driving said rigid member in either direction from one of said end limits to the other; and
    a proximity switch for signaling the arrival of said member at either of said end limits, said switch comprising,
    means operative to change conductive state in response to a control signal,
    an air coil,
    means operative to electrically energize said air coil to establish a flux field having a characteristic amplitude thereabout entirely within the atmosphere surrounding said air coil, said atmosphere comprising a substantially air filled void without ferrous material components,
    target means displaceable between a position remote from said air coil and a sensed position adjacent said air coil to effect a change in said characteristic amplitude,
    circuit means operative to generate said control signal as a function of said change in characteristic amplitude,
    means for interconnecting said member and target means to effect a lost motion therebetween whereby said target means transitions between said remote and sensed positions only as said member alternately approaches said first and second end limits of travel, and
    means operative to shield said field from external sources of electromagnetic energy.

14. The combination of claim 13, wherein said power actuated device comprises a fluid driven cylinder.

15. The combination of claim 14, wherein said fluid driven cylinder comprises a hydraulic cylinder.

16. The combination of claim 14, wherein said fluid driven cylinder comprises a pneumatic cylinder.

17. In combination:
a power actuated device including a rigid member mounted within a fixed frame for movement along a fixed path relative to said frame between a first end limit of travel and a second end limit of travel, power actuated means for driving said rigid member in either direction from one of said end limits to the other; and
a proximity switch for signaling the arrival of said member at either of said end limits, said switch comprising,
means operative to change conductive state in response to a control signal,
a housing fixedly mounted upon said frame in surrounding relationship to a slot extending through said frame along said fixed path,
an air coil fixedly mounted in said housing,
means operative to electrically energize said air coil to establish a flux field having a characteristic amplitude thereabout entirely within the atmosphere surrounding said air coil within said housing, said atmosphere comprising a substantially air filled void without ferrous metal components,
a proximity switch target member mounted in said housing for sliding movement parallel to said path between a first position wherein said target member is within actuating proximity of said air coil and a second position wherein said target member is out of actuating proximity to said air coil by effecting changes in said characteristic amplitude,
circuit means operative to generate said control signal as a function of said change in characteristic amplitude,
first abutment means on said rigid member,
second abutment means on said target member, one of said abutment means comprising means on one of said members defining an elongate recess terminating at opposite ends in abutment shoulders normal to said fixed path and the other of said abutment means comprising a projection on the other of said members projecting from said other of said members normal to said fixed path through said slot in said frame into the recess of said one of said members between said abutment shoulders, said shoulders being spaced from each other by a distance such that upon movement of said rigid member to said first end limit one of said shoulders engages said projection and pushes said target member into said first position and upon movement of said rigid member to said second end limit the other of said shoulders engages said projection and pushes said target member into said second position, and
means operative to shield said field from external sources of electromagnetic energy.

18. The combination of claim 17, wherein said power actuated device comprises a double-acting fluid driven cylinder.

* * * * *

UNITED STATES PATENT AND TRADEMARK OFFICE
CERTIFICATE OF CORRECTION

PATENT NO.   :   5,034,621
DATED        :   July 23, 1991
INVENTOR(S)  :   John P. Groves et al.

It is certified that error appears in the above-identified patent and that said Letters Patent is hereby corrected as shown below:

Column 9, Line 29:   delete "remove", insert --remote--

Column 9, Line 53:   delete "claim 2", insert --claim 1--

Signed and Sealed this

Fifth Day of October, 1993

Attest:

BRUCE LEHMAN

Attesting Officer       Commissioner of Patents and Trademarks